United States Patent [19]
Miller

[11] Patent Number: 5,508,508
[45] Date of Patent: Apr. 16, 1996

[54] APPARATUS FOR CONVERTING OPTICAL BIPOLAR SIGNALS TO OPTICAL UNIPOLAR SIGNALS

[75] Inventor: David A. B. Miller, Fair Haven, N.J.

[73] Assignee: AT&T Corp., Murray Hill, N.J.

[21] Appl. No.: 273,083

[22] Filed: Jul. 8, 1994

[51] Int. Cl.$^6$ .................................................. H04B 10/06
[52] U.S. Cl. ................................... 250/214 LS; 359/189
[58] Field of Search ...................... 250/551, 205, 250/214 R, 214.1, 214 LS; 359/189, 190, 195; 327/514; 257/14, 21

[56] References Cited

U.S. PATENT DOCUMENTS

| | | | |
|---|---|---|---|
| 4,001,578 | 1/1977 | Cook et al. | 359/158 |
| 4,355,423 | 10/1982 | Theall | 359/175 |
| 4,751,378 | 6/1988 | Hinton et al. | 250/214 LS |
| 4,896,121 | 1/1990 | Larson | 330/228 |
| 4,985,621 | 1/1991 | Aull et al. | 250/214 LS |
| 5,134,358 | 7/1992 | Agiman | 323/316 |
| 5,166,553 | 11/1992 | Kotera et al. | 307/448 |
| 5,288,990 | 2/1994 | Miller | 250/214 LS |
| 5,311,008 | 5/1994 | Miller | 250/214 LS |
| 5,369,350 | 11/1994 | Matsuda | 359/189 |

OTHER PUBLICATIONS

*IEEE Journal of Quantum Electronics*, L. A. D'Asaro et al., vol. 29, No. 2, Feb. 1993, pp. 670–677.
*Physics of Semiconductor Devices*, S. M. Sze, Wiley, NY, 2nd ed. 1981, p. 322.

"The Quantum Well Self–Electrooptic–Effect Device: Optoelectronic Bistability and Oscillation, and Self–Linearized Modulation," *IEEE Journal of Quantum Electronics*, D. A. B. Miller, vol. QE–21, No. 9, Sep. 1985, pp. 1462–1476.

"Novel Analog Self–Electrooptic–Effect Devices", *IEEE Journal of Quantum Electronics*, D. A. B. Miller, vol. 29, No. 2, Feb. 1993, pp. 678–698.

*Primary Examiner*—Edward P. Westin
*Assistant Examiner*—Steven L. Nichols
*Attorney, Agent, or Firm*—Stuart H. Mayer

[57] ABSTRACT

An apparatus for converting a bipolar optical signal to a unipolar optical signal includes first and second photodetectors electrically coupled in series for receiving the bipolar optical signal. An electro-absorption modulator such as a self-linearized modulator, for example, is electrically coupled to the photodetectors. The modulator serves to transmit therethrough a portion of the power of an optical beam in an amount proportional to the power of the bipolar optical signal to form a transmitted beam. A constant current source is provided for supplying a current that shifts the power of the optical beam transmitted through the modulator by a predetermined amount, thus forming the desired unipolar optical signal.

11 Claims, 4 Drawing Sheets

APPARATUS FOR CONVERTING OPTICAL BIPOLAR SIGNALS TO OPTICAL UNIPOLAR SIGNALS

CROSS-REFERENCE TO RELATED APPLICATIONS

This application is related to application Ser. No. 08/272,161 of David Andrew Barclay Miller, entitled "Current Mirror for Depletion-Mode Field Effect Transistors with Level Shifting", filed on Jul. 7, 1994, now abandoned, and application Ser. No. 08/273,042 of David Andrew Barclay Miller, entitled "Linear Optical Amplifier", filed on Jul. 8, 1994.

TECHNICAL FIELD

This invention relates generally to optical converters, and more particularly, to optical converters for converting an optical bipolar signal to an optical unipolar signal.

BACKGROUND OF THE INVENTION

Optical information processing entails the ability to perform analog operations such as correlation, convolution, and differentiation with optical beams. These operations provide results that are both positive and negative in value. Since the intensity of an optical beam is always positive, positive and negative values may be represented as the difference in power between two optical beams. As a result, a signal initially in unipolar form (i.e., a signal represented by the always positive-valued intensity of a single optical beam) must be converted to a signal in bipolar form (i.e., a signal that has both positive and negative values). After processing the optical signal in bipolar form, it is often desirable to convert the result back into unipolar form, particularly when the result is intended to form an image. An output that forms an image is desirable because often it may be readily understood from a visual inspection.

An apparatus for converting an optical bipolar signal to a unipolar signal is described by Miller in *IEEE J. Quantum Electron.*, Vol. 29, Number 2, February 1993, pages 678–698, specifically on page 681 and in FIG. 3 of that article. One limitation of this apparatus is that an optical bias beam must be added to one of the rails of the bipolar input signal. Accordingly, this known apparatus requires a relatively complex optical system.

SUMMARY OF THE INVENTION

In accordance with this invention, reduced optical complexity is achieved by providing an apparatus for converting a bipolar optical signal to a unipolar optical signal includes first and second photodetectors electrically coupled in series for receiving the bipolar optical signal. An electro-absorption modulator such as a self-linearized modulator, for example, is electrically coupled to the photodetectors. The modulator serves to transmit therethrough a portion of the power of an optical beam in an amount proportional to the power of the bipolar optical signal to form a transmitted beam. A constant current source is provided for supplying a current that shifts the power of the optical beam transmitted through the modulator by a predetermined amount, thus forming the desired unipolar optical signal.

In one embodiment of the invention, the constant current source is a transistor. The transistor is configured so that a voltage applied thereto determines the value of the current employed to shift the power of the optical beam. Alternatively, the constant current source may be a current mirror, in which case the value of the current is determined by an input current supplied to the input of the current mirror.

In one particular embodiment of the invention, the photodetectors are photodiodes that supply a first current to a node in response to the bipolar optical signal. The electro-absorption modulator generates a second current in response to the optical beam transmitted therethrough and supplies this second current to the node. The transistor or current mirror supplies a predetermined current to this same node.

In an alternative embodiment of the invention, a plurality of the optical bipolar to unipolar converters of the present invention are provided to form a converter array for converting a plurality of bipolar signals to a plurality of unipolar signals. A single control circuit such as the input stage of a current mirror, for example, may be used to supply the same control input (such as a control voltage) to each of the individual converters in the array so that the shift in power of the optical beam transmitted through the modulator is substantially identical for all the converters.

DETAILED DESCRIPTION

Figure 1:
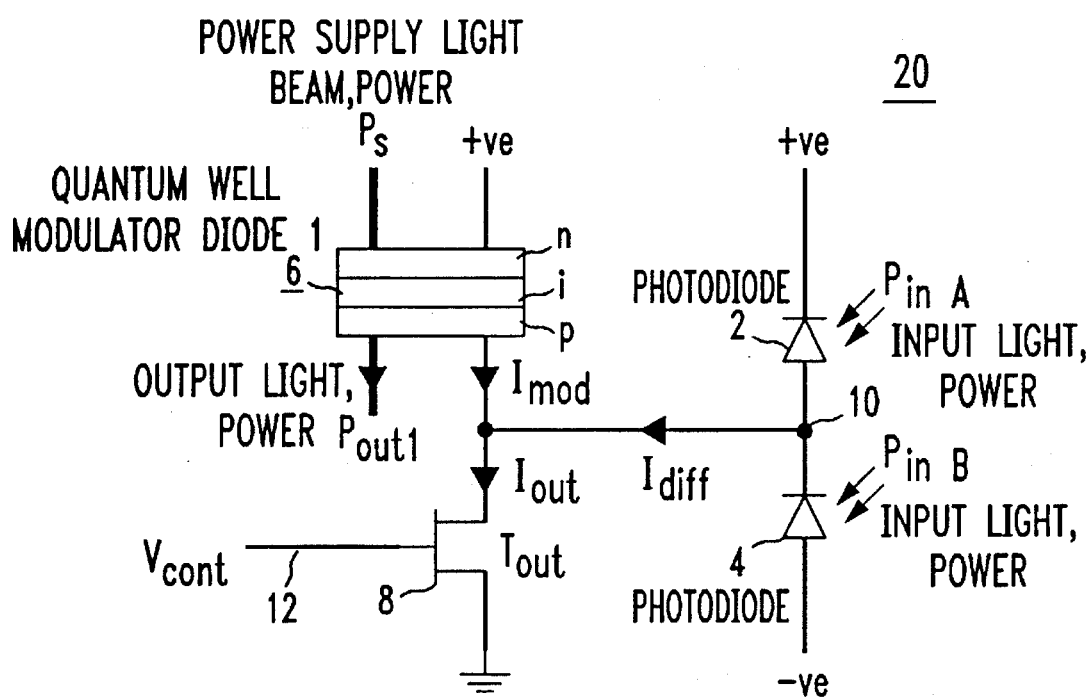
FIG. 1 shows one embodiment of an apparatus for converting a bipolar optical signal to a unipolar optical signal in accordance with the present invention.

FIG. 1 illustrates one embodiment of the optical bipolar to unipolar converter 20 of the present invention. A bipolar optical signal comprises two unipolar signals and the power of the bipolar optical signal may be represented as the difference in power between two optical signals each defining one rail of the bipolar signal. In FIG. 1 the bipolar input signal is represented by optical beams $P_{inA}$ and $P_{inB}$ and thus the value of the bipolar signal is equal to the power difference $(P_{inA}-P_{inB})$. The converter 20 includes two photodetectors 2 and 4 coupled in series. In the embodiment of the invention shown in FIG. 1 the photodetectors 2 and 4 are reversed biased photodiodes. A node 10 located between the photodiodes 2 and 4 is connected to an electro-absorption modulator 6 and the drain of an output transistor 8. The electro-absorption modulator 6 generates a photocurrent that is proportional to the power of an optical beam incident thereon. The source of the output transistor 8 is coupled to ground and the gate of the transistor 8 is coupled to a constant voltage source 12. While the embodiment of the invention shown in FIG. 1 incorporates a field-effect transistor (FET), one of ordinary skill in the art will recognize that bipolar transistors may be employed instead. However, for the sake of clarity the following discussion will describe the invention as employing a FET.

In operation, the optical input beams $P_{inA}$ and $P_{inB}$ are incident upon respective ones of the photodiodes 2 and 4. Because the photodiodes are reverse-biased, they each generate a photocurrent. As is well-known, the current generated by a typical reverse-biased photodiode is linearly proportional to the input optical power. For many photodiodes the proportionality between the current and input power is such that for every incident Photon one electron of current is generated, i.e., $$I_{PC} = \frac{e}{\hbar\omega} P_{in} \quad (1)$$

where $I_{pc}$ is the current generated by the photodiode, $\hbar\omega$ is the incident photon energy and e is the electronic charge. For the sake of clarity the following discussion will assume that the converter of the present invention employs photodiodes possessing this characteristic. However, one of ordinary skill in the art will recognize that the present invention may employ instead photodiodes having a different relationship between the incident power and the generated photocurrent. Nevertheless, regardless of the particular power-current relationship of the photodiodes employed, the net photocurrent $I_{diff}$ flowing out of the node 10 is proportional to the power difference between the optical beams $P_{inA}$ and $P_{inB}$ incident upon the photodiodes 2 and 4, respectively. Specifically, assuming that one electron is generated per incident photon, $$I_{diff} = e/\hbar\omega (P_{inA} - P_{inB}) \quad (2)$$

The output FET 8 is biased so that the current $I_{out}$ flowing through its drain is a function of the gate-source voltage and is substantially independent of the source-drain voltage. It is well-known that such ideal behavior may be obtained over a given operating range that varies from FET to FET. Accordingly, if the gate-source voltage of the output FET 8 is maintained at a constant value as indicated by the arrangement in FIG. 1, $I_{mod}$ will depend only on the currents $I_{diff}$ and $I_{out}$, where $I_{mod}$ is the current generated by the electroabsorption modulator 6. More particularly, by conservation of current $$I_{mod} = I_{out} - I_{diff} \quad (3)$$

It is well-known that certain electro-absorption modulators generate one electron of photocurrent for every photon absorbed from the incident optical power beam. For such a modulator, the photocurrent $I_{mod}$ is proportional to the optical power absorbed in the modulator 6. This mode of operation is known as the "self-linearized modulator" mode and a modulator operating in this mode is referred to as a self-linearized modulator. An example of a self-linearized modulator that may be employed in the present invention is disclosed in the reference by D. A. B. Miller et al., *IEEE Journal of Quantum Electronics*, Vol. QE-21, Number 9, September 1985, pages 1462–1476. While the electro-absorption modulators shown in FIG. 1 transmits light therethrough, other modulators may be employed in which the modulator contains a reflective surface for reflecting light back through the modulator. Moreover, other electro-absorption modulator having a self-linearized mode of operation may be employed such as, for example, a bulk semiconductor diode that utilizes the Franz-Keldysh effect. Additionally, while the present invention will be described below as employing a self-linearized modulator, one of ordinary skill in the art will recognize that any electro-absorption modulator may be used for which the generated photocurrent is proportional to the absorbed optical power.

As seen in FIG. 1, the modulator 6 is powered by an optical supply beam $P_s$ that generates the photocurrent $I_{mod}$. The modulator 6 emits an optical output beam $P_{out}$ that is smaller than the optical supply beam $P_s$ due to the photons absorbed to generate the photocurrent $I_{mod}$. If the modulator 6 operates in the self-linearized mode, the output beam $P_{out}$ is smaller than the supply beam $P_s$ by an amount corresponding to one photon for every electron of current generated by the modulator, i.e., $$P_{out} = P_s - (\hbar\omega/e)I_{mod} \quad (4)$$

Eliminating $I_{mod}$ by substituting equation 3 into equation 4 yields:

$$P_{out} = P_S - \frac{\hbar\omega}{e} (I_{out} - I_{diff}) \quad (5)$$

Finally, substituting equation 2 into equation 5 provides a relationship between the output beam $P_{out}$ and the difference between input signals $P_{inA}$ and $P_{inB}$:

$$P_{out} = (P_{inA} - P_{inB}) + P_{S1} - \frac{\hbar\omega}{e} I_{out} \quad (6)$$

Accordingly, the power of the output beam $P_{out}$ is proportional to the input power difference $(P_{inA} - P_{inB})$ of the bipolar input signal, offset by an amount linearly dependent on the current $I_{out}$ flowing through the drain of the output FET 8. It should be noted that if the term $I_{out}$ were not present in equation (6) the converter 20 could not convert an input signal for which PinA was greater than $P_{inB}$ because such a situation would require that the output beam power $P_{out}$ be greater than the supply beam $P_S$, which is not possible because the modulator 6 is not a source of optical energy. In fact, if the term in equation 6 containing $I_{out}$ were not present the modulator would not operate in its self-linearized mode whenever $P_{inA}$ was greater than $P_{inB}$.

Figure 2:
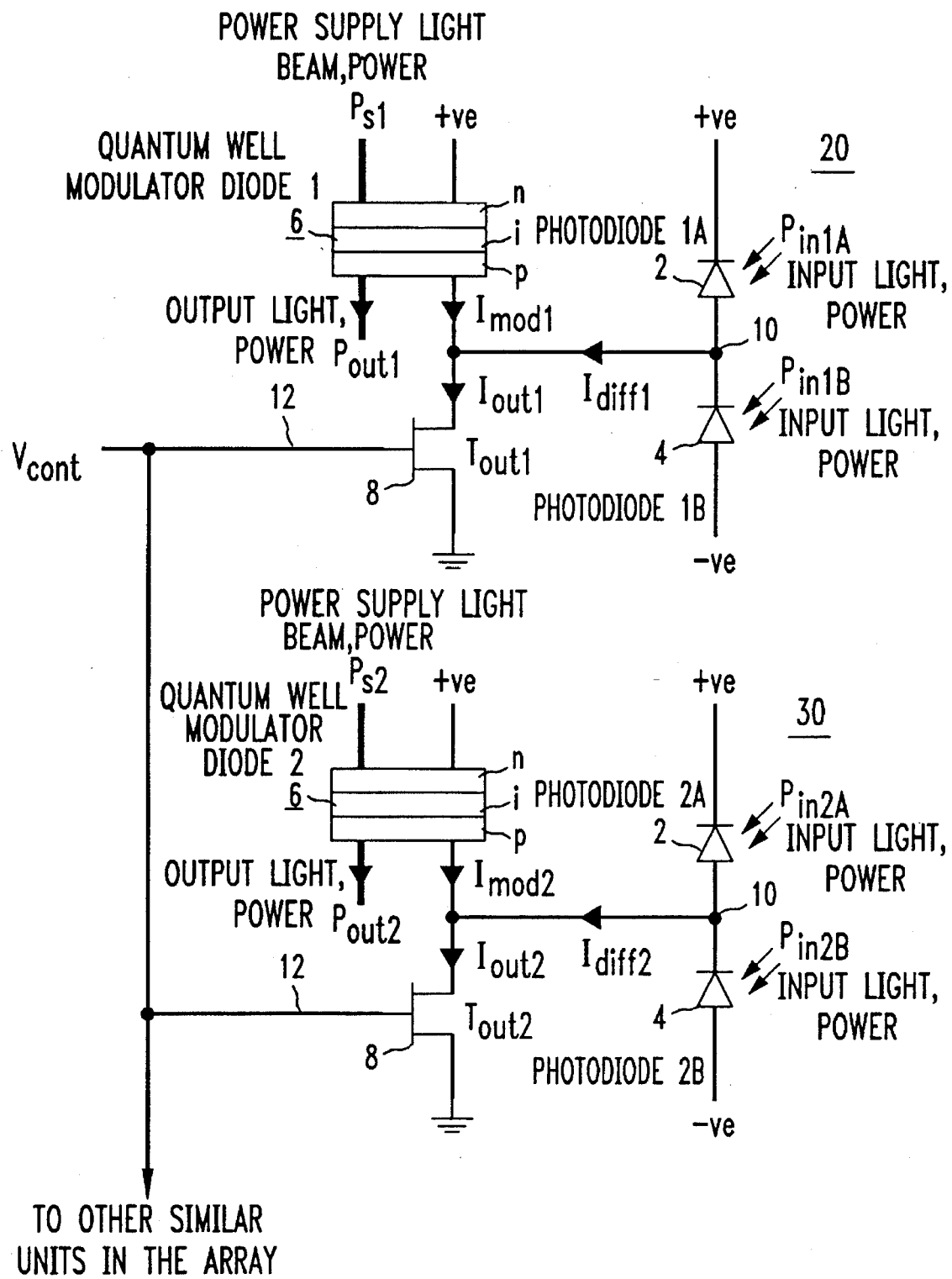
FIG. 2 shows one embodiment of a converter array that includes a plurality of the converters shown in FIG. 1.

FIG. 2 shows a converter array that includes two converters 20 and 30 in accordance with the present invention. While the converter array shown in FIG. 2 includes only two converters, one of ordinary skill in the art will recognize that the array may include as many converters as desired for a particular application. As indicated in FIG. 2, the converters all may be powered by the same control voltage source 12 supplied to the gate of each transistor. One advantage achieved by employing a single control voltage is that if the output transistors employed in each converter are substantially the same, then each converter will provide the same linear offset to the bipolar signal when it is converted to a unipolar signal since the values of $I_{out}$ for all the output transistors will be the same (see equation 6).

Figure 3:
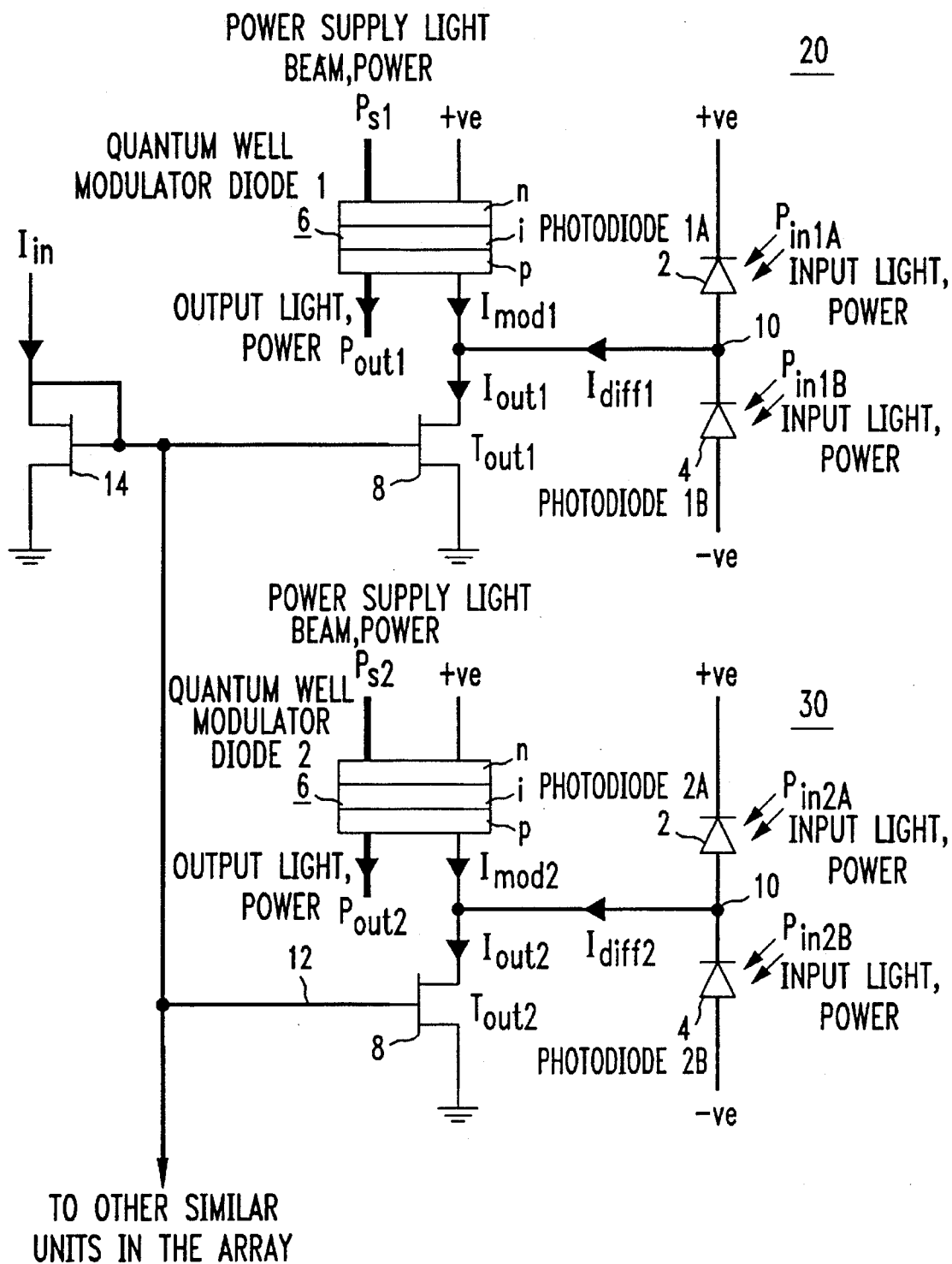
FIG. 3 shows an alternative embodiment of the converter array shown in FIG. 2 in which the control voltage source is replaced with a control transistor.

In an alternative embodiment of the invention the control voltage source 12 may be replaced by a control transistor 14 such as shown in FIG. 3, which is powered by an input current. The gate of the control transistor 14 is coupled to the gate of each output transistor of each individual converter employed in the array. The control transistor 14 is arranged so that it forms a current mirror with each of the output transistors. Current mirrors are well-known and serve to reproduce a current from one location to one or more other locations.

Figure 4:
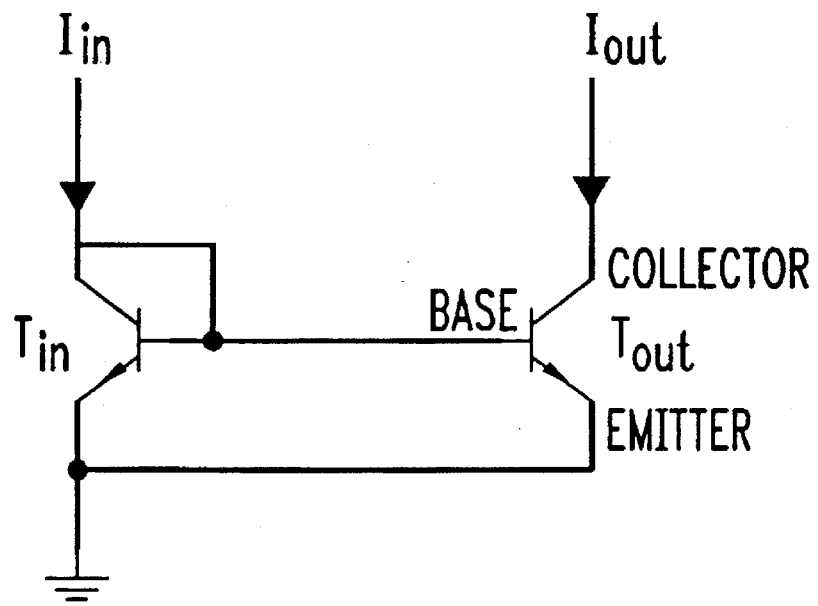
FIGS. 4–5 show examples of known current mirror circuits.
Figure 5:
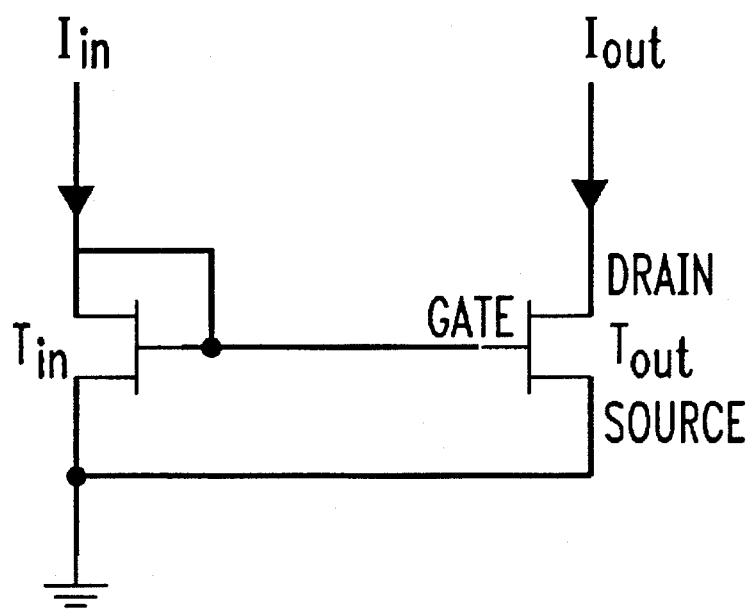

FIGS. 4–5 show examples of current mirrors that employ bipolar transistors and enhancement-mode FETS, respectively. Examples of various current mirrors are disclosed in U.S. Pat. Nos. 5,134,358, 5,166,553 and 4,896,121. Another current mirror that may be employed in the present invention is disclosed in the co-pending application entitled "Current Mirror in Depletion-Mode Field Effect Transistor with Level Shifting," by D. A. B. Miller, filed in the U.S. Patent and Trademark Office on Jul. 7, 1994, which is hereby incorporated by reference. Regardless of the type of transistor employed, each current mirror shown in FIGS. 4–5 has an input transistor $T_{in}$ and an output transistor $T_{out}$ whose gates (or bases in the case of the bipolar transistors shown in FIG.

4) are coupled together. The sources (or emitters) of the input and output transistors $T_{in}$ and $T_{out}$ are also coupled together and in the exemplary current mirrors shown in the figures the sources (or emitters) are connected to ground. The drain (or collector) of the input transistor $T_{in}$ is coupled to the gate (or base) of both the input and output transistors $T_{in}$ and $T_{out}$. In operation, a current $I_{in}$ supplied to the drain (or collector) of the input transistor $T_{in}$ will be reproduced at the drain (or collector) of the output transistor $T_{out}$. If the input and output transistors are not identical, the input current $I_{in}$ will be proportional to the output current $I_{out}$ with non-unity gain. In FIG. 3, the control transistor 14 forms the input transistor of the current mirrors and the output transistors of each converter in the array form the corresponding output transistors of the respective current mirrors.

The control transistor 14 allows the output current $I_{out}$ of each converter to be controlled by a single input current $I_{in}$ supplied to the converter array. As a result, the value of the input current determines the value of the offset applied to the bipolar signal when it is converted to a unipolar signal. This arrangement may be advantageous over the arrangement in FIG. 2, in which the control voltage determines the value of the offset, because the offset is linearly proportional to the input current supplied to the control transistor 14. In contrast, if a control voltage is used, the offset generally will not be linearly proportional to the control voltage. This nonlinear relationship occurs because the source-gate (or emitter-base) voltage of a transistor is not in general linearly proportional to the source-drain (or emitter-collector) current. Another advantage achieved by using an input current to control the converter array rather than a control voltage is that the characteristics of a current mirror are relatively insensitive to temperature changes whereas a single transistor is significantly temperature dependent. In the case of bipolar transistors particularly, the relationship between the emitter-collector current and the emitter-base voltage is very temperature dependent.

The converter and converter array of the present invention may be fabricated from discrete components or as a single component monolithically integrated on a semiconductor wafer. Monolithic integration employing enhancement-mode FETs may be achieved by using conventional GaAs fabrication technology such as described in S. M. Sze, *Physics of Semiconductor Devices*, Wiley, New York, 2nd ed. 1981, p. 322. Monolithic integration employing depletion-mode FETs, quantum well modulators, and photodetectors may be achieved, for example, by a method disclosed in L. A. D'Araro et al., *IEEE Journal of Quantum Electronics*, Vol. 29, Number 2, February 1993, pages 670–677.

I claim:

1. An apparatus for converting a bipolar optical signal to a unipolar optical signal, comprising:

first and second photodetectors coupled in series for receiving a bipolar optical signal; and an electro-absorption modulator and a first transistor serially coupled to said modulator, said modulator being responsive to an electrical signal received from said first and second photodetectors for providing a unipolar optical output signal;

a second transistor electrically coupled to said first transistor such that said first and second transistors form a current mirror.

2. An apparatus for converting a bipolar optical signal to a unipolar optical signal, comprising:

first and second photodetectors coupled in series for collectively generating a first photocurrent supplied to a node;

an electro-absorption modulator coupled to said first and second photodetectors for generating a second photocurrent in response to an optical beam and for supplying said second photocurrent to said node; and a constant current source for supplying a predetermined current to said node.

3. The apparatus of claim 2 wherein said electro-absorption modulator is a self-linearized modulator for generating one electron of photocurrent for each photon absorbed by said electro-absorption modulator.

4. The apparatus of claim 2 wherein said constant current source is a transistor and the value of said predetermined current is controllable by a voltage supplied to said transistor.

5. The apparatus of claim 4 wherein said transistor is a field effect transistor having its drain electrically connected to said node.

6. The apparatus of claim 4 wherein said first and second photodetectors are photodiodes.

7. The apparatus of claim 6 wherein said electro-absorption modulator is a self-linearized modulator for generating one electron of photocurrent for each photon absorbed by said electro-absorption modulator and said photodiodes are configured to generate one electron of photocurrent for every photon of optical energy incident thereon.

8. An apparatus for converting a bipolar optical signal to a unipolar optical signal, comprising:

first and second photodetectors coupled in series for collectively generating a first photocurrent supplied to a node;

an electro-absorption modulator coupled to said first and second photodetectors for generating a second photocurrent in response to an optical beam and for supplying said second photocurrent to said node; and a constant current source for supplying a predetermined current to said node, wherein said constant current source comprises a current mirror.

9. An apparatus for converting a plurality of bipolar optical signals to a plurality of unipolar optical signals, comprising:

a plurality of optical converters, each of said converters including;
   first and second photodetectors coupled in series for collectively generating a first photocurrent supplied to a node;
   an electro-absorption modulator coupled to said photodetectors for generating a second photocurrent in response to an optical beam and for supplying said second photocurrent to said node; and means for supplying a predetermined current to said node, wherein said current supply means of a plurality of all of said optical converters comprises a constant current source for supplying a substantially identical predetermined current to each of the nodes in each of the plurality of optical converters and wherein said constant current source comprises a plurality of current mirrors.

10. An apparatus for converting a bipolar optical signal to a unipolar optical signal, comprising:

first and second photodetectors electrically coupled in series for receiving a bipolar optical signal;

an electro-absorption modulator electrically coupled to said photodetectors for transmitting therethrough a portion of the power of an optical beam in an amount proportional to the power of the bipolar optical signal to form a transmitted beam; and means for selectively shifting the power of the transmitted beam by a predetermined amount to form a unipolar optical signal.

11. The apparatus of claim 10 wherein said shifting means comprises a transistor for supplying a current that determines said predetermined amount of shift.

* * * * *